United States Patent
He et al.

(10) Patent No.: US 9,030,819 B2
(45) Date of Patent: May 12, 2015

(54) MOUNTING APPARATUS FOR DATA STORAGE DEVICE

(71) Applicant: Zhongshan Innocloud Intellectual Property Services Co., Ltd., Zhongshan (CN)

(72) Inventors: Yu-Wei He, Shenzhen (CN); Xiu-Quan Hu, Shenzhen (CN)

(73) Assignee: Zhongshan Innocloud Intellectual Property Services Co., Ltd., Zhongshan (CN)

( * ) Notice: Subject to any disclaimer, the term of this patent is extended or adjusted under 35 U.S.C. 154(b) by 72 days.

(21) Appl. No.: 13/685,645

(22) Filed: Nov. 26, 2012

(65) Prior Publication Data

US 2013/0277512 A1 Oct. 24, 2013

(30) Foreign Application Priority Data

Apr. 20, 2012 (CN) .......................... 2012 1 0117546

(51) Int. Cl.
*G06F 1/16* (2006.01)
*H05K 5/00* (2006.01)
*H05K 7/00* (2006.01)
*H05K 7/14* (2006.01)
*G11B 33/12* (2006.01)

(52) U.S. Cl.
CPC ................ *H05K 7/14* (2013.01); *G11B 33/124* (2013.01)

(58) Field of Classification Search
USPC ............. 361/679.58, 679.31, 679.33, 679.37, 361/679.39; 248/220.21, 220.22, 221.11, 248/222.51, 222.52, 223.41, 225.11, 27.1, 248/222.11, 222.12, 222.13, 224.8; 312/223.2
See application file for complete search history.

(56) References Cited

U.S. PATENT DOCUMENTS

| 5,077,722 | A | * | 12/1991 | Geist et al. .................... 720/657 |
| 5,557,499 | A | * | 9/1996 | Reiter et al. ............. 361/679.39 |
| 5,588,728 | A | * | 12/1996 | Eldridge et al. ........... 312/332.1 |
| 6,625,014 | B1 | * | 9/2003 | Tucker et al. ............ 361/679.34 |
| 6,816,367 | B2 | * | 11/2004 | Liu et al. .................. 361/679.33 |
| 7,031,152 | B1 | * | 4/2006 | Tsai et al. ................ 361/679.33 |
| 7,090,528 | B2 | * | 8/2006 | Tuttle et al. .................. 439/383 |
| 7,126,817 | B2 | * | 10/2006 | Li ............................ 361/679.37 |
| 7,344,394 | B1 | * | 3/2008 | Barina et al. .................. 439/157 |
| 2004/0017650 | A1 | * | 1/2004 | Liu et al. ........................ 361/685 |
| 2005/0063151 | A1 | * | 3/2005 | Dean et al. ..................... 361/685 |
| 2005/0111178 | A1 | * | 5/2005 | Bradley et al. ................ 361/684 |
| 2006/0139872 | A1 | * | 6/2006 | Li et al. ......................... 361/685 |
| 2007/0014085 | A1 | * | 1/2007 | Meserth et al. ................ 361/685 |
| 2009/0273901 | A1 | * | 11/2009 | Jaramillo et al. ......... 361/679.58 |
| 2011/0267766 | A1 | * | 11/2011 | Wu .......................... 361/679.37 |
| 2011/0289521 | A1 | * | 11/2011 | Chen ............................. 720/601 |
| 2012/0087084 | A1 | * | 4/2012 | Nguyen et al. ........... 361/679.37 |

* cited by examiner

*Primary Examiner* — Terrell McKinnon
*Assistant Examiner* — Michael McDuffie
(74) *Attorney, Agent, or Firm* — Novak Druce Connolly Bove + Quigg LLP

(57) ABSTRACT

A mounting apparatus includes a mounting piece and a drive bracket. A first restricting piece is formed on a top side of the mounting piece. A first sliding member is formed on the first restricting piece. The drive bracket includes a side piece which defines a sliding groove. The sliding groove includes a guiding portion and a restricting portion. The drive bracket includes a handle pivotally mounted thereon. The handle includes a locking portion. The locking portion defines a cutout. The handle is rotated between a first position and a second position. In the first position, the cutout is aligned to the guiding portion to receive the first sliding member in the cutout and the guiding portion. In the second position, the sliding member is restricted in the restricting portion by the locking portion to mount the drive bracket on the top side of the mounting piece.

14 Claims, 5 Drawing Sheets

MOUNTING APPARATUS FOR DATA STORAGE DEVICE

BACKGROUND

1. Technical Field

The present disclosure relates to mounting apparatuses, and more particularly to a mounting apparatus for mounting data storage devices in an electronic device.

2. Description of Related Art

Data storage devices, such as hard disk drives, floppy disk drives, and optical drives are used in electronic devices such as computers and servers. These data storage devices may be mounted in a bracket of an electronic device with a plurality of screws. But space in the electronic device is limited, particularly for mini personal computers. It is difficult to remove the date storage devices from the small electronic device when they need to be repaired.

Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean "at least one."

Figure 1:
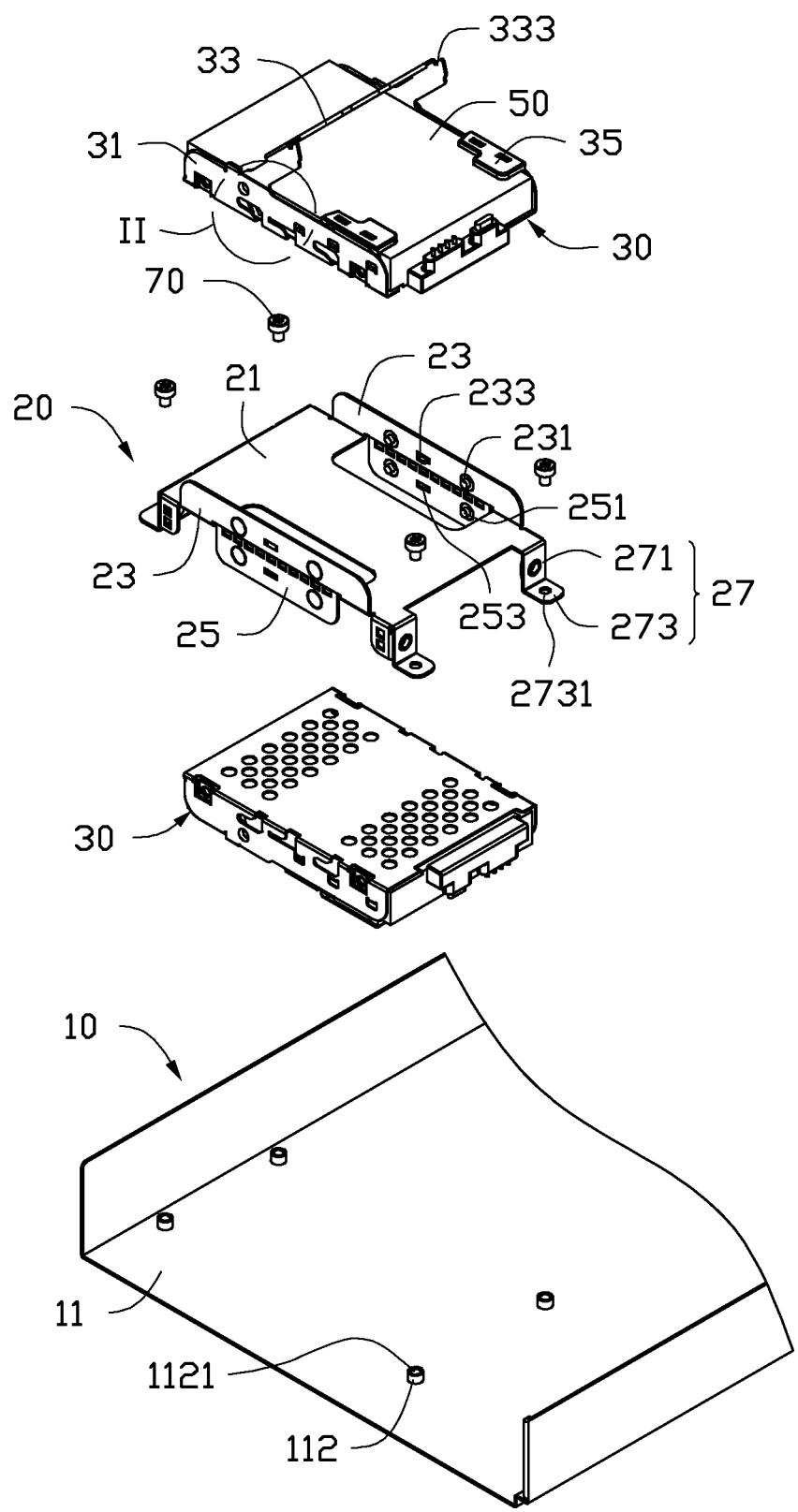
FIG. 1 is an exploded and isometric view of a mounting apparatus for a data storage device in accordance with an embodiment.

Referring to FIG. 1, a mounting apparatus in accordance with an embodiment supports two data storage devices 50. The mounting apparatus includes an enclosure 10, a mounting piece 20 and two drive brackets 30. The two data storage devices 50 are secured in the two drive brackets 30.

The enclosure 10 includes a bottom plate 11. Four securing posts 112 protrude from the bottom plate 11. Each securing post 112 defines a securing hole 1121.

The mounting piece 20 includes a main body 21. Opposite edges of the main body 21 extend upwardly to form a pair of first restricting pieces 23. Opposite edges of the main body 21 extend downwardly to form a pair of second restricting pieces 25. Four corners of the main body 21 extend downwardly and bend perpendicularly to form four supporting legs 27. Each supporting leg 27 includes a connection portion 271 connected to the main body 21 and a stand piece 273. The stand piece 273 defines a through hole 2731. Each first restricting piece 23 includes a pair of first sliding members 231. A positioning piece 233 is formed between the pair of first sliding members 231. Each second restricting piece 25 includes a pair of second sliding members 251. A stop piece 253 is formed between the pair of second sliding members 251.

The drive bracket 30 includes a pair of side pieces 31. The pair of side pieces 31 sandwiches the data storage device 50 therebetween. A handle 33 is pivotally mounted on the pair of side pieces 31. Each side piece 31 includes a sliding piece 35 which slides on a top edge of the side piece 31.

Figure 2:
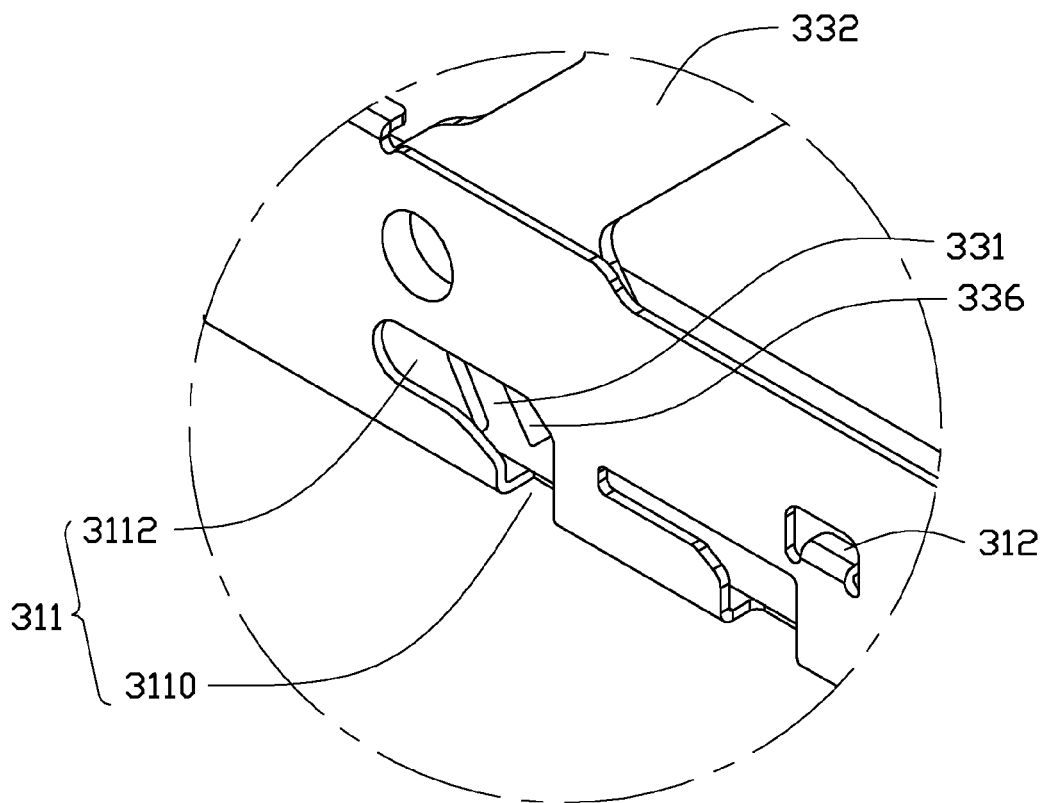
FIG. 2 is an enlarged view of the encircled portion II of FIG. 1.

Referring to FIG. 2, each side piece 31 defines a pair of sliding grooves 311 corresponding to the pair of first sliding members 231 or second sliding members 251. Each sliding groove 311 includes a guiding portion 3110 and a restricting portion 3112. The guiding portion 3110 extends to a bottom edge of the side piece 31. A positioning slot 312 is defined between the pair of the sliding grooves 311.

The handle 33 includes a pair of arms 332 pivotally connected to the pair of side pieces 31. One end of each arm 332, which is connected to the side piece 31, includes a locking portion 336. The locking portion 336 defines a cutout 331. The other end of each arm 332 includes an abutting portion 333 (see FIG. 1). The handle 33 rotates on the drive bracket 30 between a first position (see FIG. 2) and a second position (see FIG. 4). At the first position, the cutout 331 is aligned to the guiding portion 3110. At the second position, the cutout 331 is aligned to the restricting portion 3112.

Figure 3:
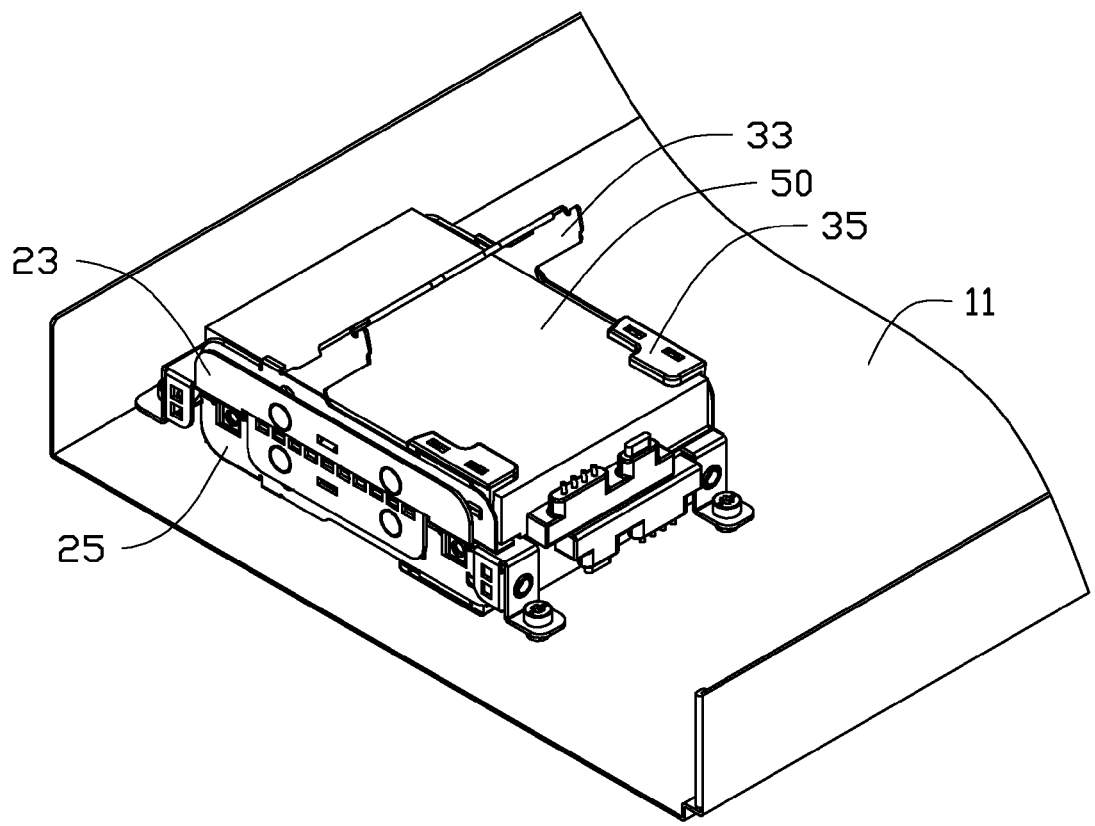
FIG. 3 is an assembled view of the mounting apparatus of FIG. 1.
Figure 4:
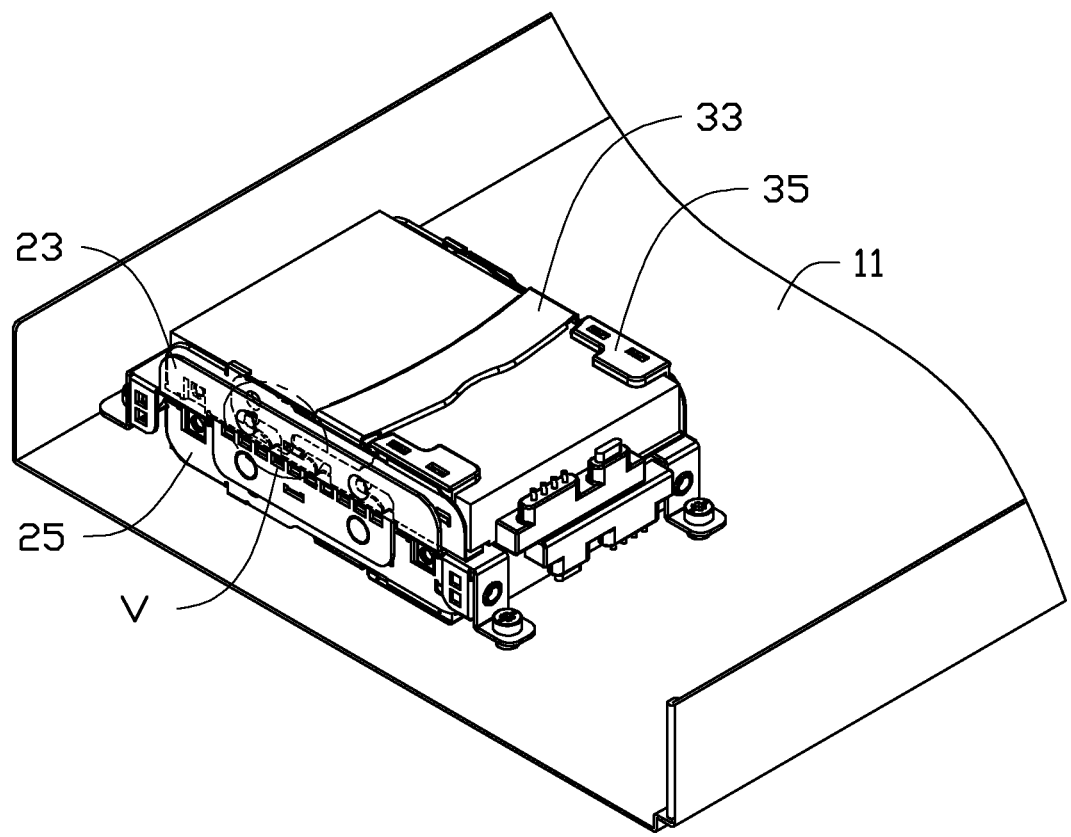
FIG. 4 is another assembled view of the mounting apparatus of FIG. 1.
Figure 5:
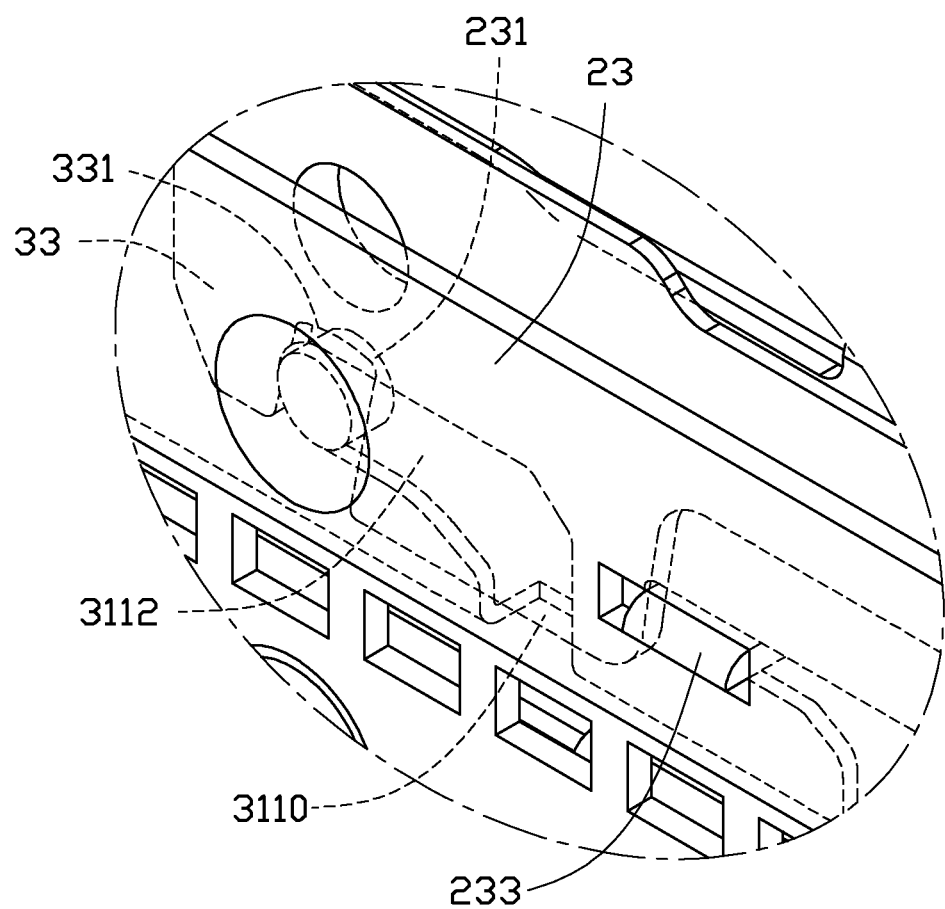
FIG. 5 is an enlarged view of the encircled portion V of FIG. 4.

Referring to FIGS. 3 to 5, in assembly of one drive bracket 30, the handle 33 of the drive bracket 30 rotates to the first position. The drive bracket 30 is placed on a top side of the main body 21 and located between the pair of first restricting pieces 23. The first sliding member 231 of the first restricting piece 23 slides in the guiding portion 3110 of the sliding groove 311 and the cutout 331. The handle 33 rotates from the first position to the second position to move the drive bracket 30. Simultaneously, the handle 33 drives the first sliding member 231 to slide from the guiding portion 3110 to the restricting portion 3112 of the sliding groove 311. At the second position, the positioning piece 233 of the mounting piece 20 is located in the positioning slot 312 of the drive bracket 30. The locking portion 336 of the handle 33 keeps the first sliding member 231 captive in the restricting portion 3112. Then, the sliding piece 35 slides on the side piece 31 to press the abutting portion 333 of the handle 33 to prevent the handle 33 from rotating freely. Thereby, the drive bracket 30 is mounted on the top side of the mounting piece 20.

A second or subsequent drive bracket 30 is mounted on a bottom side of the mounting piece 20 in the same way as the above drive bracket 30.

Finally, the support legs 27 of the mounting piece 20 are placed on securing posts 112 of the bottom plate 11 of the enclosure 10. The through holes 2731 of the support legs 27 are aligned to the securing holes 1121. Four screws 70 are mounted in the through holes 2731 and the securing holes 1121 to secure the mounting piece 20 in the enclosure 10.

To disassemble the drive bracket 30, the screws 70 are detached from the through holes 2731 and the securing holes 1121, to detach the mounting piece 20 from the enclosure 10. Then, the sliding piece 35 slides on the side piece 31 to not press against the abutting portion 333 of the handle 33. Then, the handle 33 is rotated to the second position to move the drive bracket 30. Simultaneously, the handle 33 drives the first sliding member 231 to slide from the restricting portion 3112 to the guiding portion 3110 of the sliding groove 311. Then, the first sliding member 231 can slide out of the guiding portion 3110 to detach the drive bracket 30 from the mounting piece 20.

It is to be understood, however, that even though numerous characteristics and advantages of the embodiments have been set forth in the foregoing description, together with details of the structure and functions of the embodiments, the disclosure is illustrative only, and changes may be made in detail, especially in the matters of shape, size, and arrangement of parts within the principles of the present disclosure to the full extent indicated by the broad general meaning of the terms in which the appended claims are expressed.

What is claimed is:

1. A mounting apparatus for a first data storage device, comprising:
    a mounting piece, a first restricting piece formed on a top side of the mounting piece, a first sliding member formed on the first restricting piece; and
    a drive bracket receiving the first data storage device therein, the drive bracket comprises a side piece, the side piece defining a sliding groove which comprises a guiding portion and a restricting portion, the drive bracket comprises a handle pivotally mounted thereon, the handle comprises a locking portion, and the locking portion defines a cutout;
    wherein the handle is configured to rotate between a first position and a second position; at the first position, the cutout is aligned to the guiding portion to receive the first sliding member in the cutout and the guiding portion; at the second position, the first sliding member is restricted in the restricting portion by the locking portion to mount the drive bracket on the top side of the mounting piece;
    wherein the side piece defines a positioning slot, the first restricting piece comprises a positioning piece, the positioning piece is configured to be positioned in the positioning slot when the handle is in the second position.

2. The mounting apparatus of claim 1, wherein a second restricting piece is formed on a bottom side of the mounting piece, the second restricting piece comprises a second sliding member, and a second drive bracket is mounted on the bottom side of the mounting piece as the drive bracket mounted on the top side of the mounting piece.

3. The mounting apparatus of claim 1, wherein the side piece comprises a sliding piece which slides on a top edge of the side piece, the handle comprises an abutting portion, the sliding piece is configured to slide on the side piece to press the abutting portion to prevent the handle from rotating freely when the handle is at the second position.

4. The mounting apparatus of claim 1, further comprising an enclosure, wherein the mounting piece is mounted in the enclosure.

5. The mounting apparatus of claim 4, wherein the enclosure comprises a bottom plate, the bottom plate comprises four securing posts, the mounting piece comprises four support legs, and the four support legs are located on the four securing posts.

6. The mounting apparatus of claim 5, wherein each of the four support legs comprises a stand piece, the stand piece defines a through hole; each of the four securing posts defines a securing hole, and a screw is mounted in the through hole and the securing hole.

7. The mounting apparatus of claim 1, wherein the guiding portion extends to a bottom edge of the side piece.

8. A mounting apparatus for data storage devices, comprising:
    a mounting piece, a first restricting piece formed on a top side of the mounting piece, a first sliding member formed on the first restricting piece; a second restricting piece formed on a bottom side of the mounting piece, a second sliding member formed on the second restricting piece;
    a first drive bracket receiving a first data storage device therein, the first drive bracket comprising a first side piece, the first side piece defining a first sliding groove; and
    a second drive bracket receiving a second data storage device therein, the second drive bracket comprising a second side piece, the second side piece defining a second sliding groove;
    wherein the first sliding member is configured to be received in the first sliding groove to mount the first drive bracket on the top side of the mounting piece, and the second sliding member is configured to be receive in the second sliding groove to mount the second drive bracket on the bottom side of the mounting piece;
    wherein the first side piece defines a positioning slot, the first restricting piece comprises a positioning piece, the positioning piece is configured to be positioned in the positioning slot when the handle is in the second position.

9. The mounting apparatus of claim 8, wherein the first sliding groove comprises a guiding portion and a restricting portion, the first drive bracket comprises a handle pivotally mounted thereon, the handle comprises a locking portion, the locking portion defining a cutout, the handle is configured to rotate between a first position and a second position; at the first position, the cutout is aligned to the guiding portion to receive the first sliding member in the cutout and the guiding portion; at the second position, the first sliding member is restricted in the restricting portion by the locking portion to mount the first drive bracket on the top side of the mounting piece.

10. The mounting apparatus of claim 9, wherein the first side piece comprises a sliding piece which slides on a top edge of the first side piece, the handle comprises an abutting portion, the sliding piece is configured to slide on the first side piece to press the abutting portion to prevent the handle from rotating freely when the handle is at the second position.

11. The mounting apparatus of claim 9, wherein the guiding portion extends to a bottom edge of the first side piece.

12. The mounting apparatus of claim 8, further comprising an enclosure, wherein the mounting piece is mounted in the enclosure.

13. The mounting apparatus of claim 12, wherein the enclosure comprises a bottom plate, the bottom plate comprises four securing posts, the mounting piece comprises four support legs, and the four support legs are located on the four securing posts.

14. The mounting apparatus of claim 13, wherein each of the four support legs comprises a stand piece, the stand piece defines a through hole; each of the four securing posts defines a securing hole, and a screw is mounted in the through hole and the securing hole.

* * * * *